(12) United States Patent
Zhang et al.

(10) Patent No.: US 10,431,143 B2
(45) Date of Patent: Oct. 1, 2019

(54) SHIFT REGISTER, DRIVING METHOD THEREOF, GATE DRIVING CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Miao Zhang, Beijing (CN); Mo Chen, Beijing (CN); Jing Sun, Beijing (CN); Wuxia Fu, Beijing (CN)

(73) Assignees: BOE TECHNOLOGY GROUP CO., LTD., Beijing (CN); HEFEI XINSHENG OPTOELECTRONCIS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/761,497

(22) PCT Filed: Oct. 10, 2017

(86) PCT No.: PCT/CN2017/105496
§ 371 (c)(1),
(2) Date: Mar. 20, 2018

(87) PCT Pub. No.: WO2018/161561
PCT Pub. Date: Sep. 13, 2018

(65) Prior Publication Data
US 2019/0088190 A1    Mar. 21, 2019

(30) Foreign Application Priority Data

Mar. 9, 2017 (CN) .......................... 2017 1 0137323

(51) Int. Cl.
*G09G 3/3266* (2016.01)
*G09G 3/36* (2006.01)
(Continued)

(52) U.S. Cl.
CPC ............. *G09G 3/2092* (2013.01); *G09G 3/20* (2013.01); *G09G 3/3266* (2013.01);
(Continued)

(58) Field of Classification Search
CPC ......... G09G 2310/0286; G09G 3/3677; G11C 19/287
See application file for complete search history.

(56) References Cited

U.S. PATENT DOCUMENTS 9,990,897 B2 * 6/2018 Pang ..................... G11C 19/287
10,049,609 B2 * 8/2018 Wang .................... G11C 19/28
(Continued)

FOREIGN PATENT DOCUMENTS

| CN | 101673526 A | 3/2010 |
|---|---|---|
| WO | 2014141800 A1 | 9/2014 |

OTHER PUBLICATIONS

English translation of International Search Report dated Jan. 11, 2018, issued in counterpart International Application No. PCT/CN2017/105496 (12 pages).

*Primary Examiner* — William Boddie
*Assistant Examiner* — Bipin Gyawali
(74) *Attorney, Agent, or Firm* — Westerman, Hattori, Daniels & Adrian, LLP

(57) ABSTRACT

A shift register includes a first input circuit, a second input circuit, and a pull-up transistor. The first input circuit is coupled to a first input terminal and a first pull-up node, and configured to electrically connect the first input terminal to the first pull-up node when the first input terminal receives an active signal. The second input circuit is coupled to a
(Continued)

second input terminal and a second pull-up node, and configured to electrically connect the second input terminal to the second pull-up node when the second input terminal receives an active signal. The pull-up transistor includes a first gate electrode coupled to the first pull-up node and a second gate electrode coupled to the second pull-up node.

14 Claims, 12 Drawing Sheets

(51) Int. Cl.
   *G11C 19/18* (2006.01)
   *G11C 19/28* (2006.01)
   *G09G 3/20* (2006.01)

(52) U.S. Cl.
   CPC ......... *G09G 3/3677* (2013.01); *G11C 19/184* (2013.01); *G11C 19/28* (2013.01); *G11C 19/287* (2013.01); *G09G 2300/0426* (2013.01); *G09G 2310/0267* (2013.01); *G09G 2310/0286* (2013.01)

(56) References Cited

U.S. PATENT DOCUMENTS

| | | | |
|---|---|---|---|
| 10,115,335 B2* | 10/2018 | Zheng | G09G 3/2092 |
| 10,157,683 B2* | 12/2018 | Jang | G09G 3/20 |
| 10,186,221 B2* | 1/2019 | Shang | G09G 3/36 |
| 10,204,694 B2* | 2/2019 | Zhao | G11C 19/18 |
| 2010/0026346 A1 | 2/2010 | Chiang et al. | |
| 2011/0150169 A1 | 6/2011 | Lin et al. | |
| 2012/0206168 A1 | 8/2012 | Park et al. | |
| 2016/0042806 A1 | 2/2016 | Ogawa et al. | |
| 2016/0189794 A1* | 6/2016 | Lou | G11C 19/28 345/214 |

* cited by examiner

Provide an active signal to the first input terminal IN_1 of the shift register and an inactive signal to the clock signal terminal CLK of the shift register, in a charging phase of the shift register when the odd-numbered image frame is being displayed, such that, in the shift register, the first input terminal IN_1 is electrically connected to the first pull-up node PU_1, the clock signal terminal CLK is electrically connected to the signal output terminal OUT, and the signal output terminal OUT outputs an inactive signal. ⟶ S1411

Provide an active signal to the clock signal terminal CLK of the shift register and an inactive signal to the first input terminal IN_1, in an output phase of the shift register when the odd-numbered image frame is being displayed, such that the first pull-up node PU_1 floats, and the signal output terminal OUT is electrically connected to the clock signal terminal. As a result, the signal output terminal OUT outputs an active signal, and the electric potential of the first pull-up node PU_1 is further increased. ⟶ S1412

Provide an active signal to the reset terminal RESET of the shift register, in a reset phase of the shift register when the odd-numbered image frame is being displayed, such that the first pull-up node PU_1, the second pull-up node PU_2 of the shift register, and the signal output terminal OUT are electrically connected to the inactive signal terminal VSS. ⟶ S1413

Provide an active signal to the second input terminal IN_2 of the shift register and an inactive signal to the clock signal terminal CLK, in the charging phase of the shift register when the even-numbered image frame is being displayed, such that, in the shift register, the second input terminal IN_2 is electrically connected to the second pull-up node PU_2, the clock signal terminal CLK is electrically connected to the signal output terminal OUT, and the signal output terminal OUT outputs an inactive signal. ⟶ S1421

Provide an active signal to the clock signal terminal CLK of the shift register and an inactive signal to the second input terminal IN_2, in the output phase of the shift register when the even-numbered image frame is being displayed, such that the second pull-up node PU_2 floats, and the signal output terminal OUT is electrically connected to the clock signal terminal CLK. As a result, the signal output terminal OUT outputs an active signal, and the electric potential of the second pull-up node PU_2 is further increased. ⟶ S1422

Provide an active signal to the reset terminal RESET of the shift register, in the reset phase of the shift register when the even-numbered image frame is being displayed, such that the first pull-up node PU_1, the second pull-up node PU_2, and the signal output terminal OUT are electrically connected to the inactive signal terminal VSS. ⟶ S1423

SHIFT REGISTER, DRIVING METHOD THEREOF, GATE DRIVING CIRCUIT AND DISPLAY DEVICE

CROSS-REFERENCE TO RELATED APPLICATION

This PCT patent application claims priority to Chinese Patent Application No. 2017101373219, filed on Mar. 9, 2017, the entire contents of which are incorporated herein by reference.

TECHNICAL FIELD

The present disclosure generally relates to the field of display technologies and, more particularly, to a shift register, a driving method thereof, a gate driving circuit and a display device.

BACKGROUND

Gate On Array (GOA) technology is a process technology in which a gate-driving circuit is integrated in the array substrate to replace an external driver chip. GOA technology has features such as reducing production costs and reducing production processes and, thus has a broad application. The gate driving circuit includes a plurality of cascaded shift registers. Each shift register corresponds to a gate line. In the display period of one image frame, the gate driving circuit sequentially provides a scanning signal to each gate line.

FIG. 1 illustrates a schematic view of a shift register in the existing technology. As shown in FIG. 1, the shift register includes four thin film transistors, i.e., a first transistor M11, a second transistor M12, a third transistor M13, and a fourth transistor M14, a capacitor C, a clock signal terminal CLK, an input terminal IN, an output terminal, a reset terminal RESET, an inactive signal terminal VSS, and a pull-up node. In a charging phase of the shift register, the input terminal IN inputs a high level signal, the clock signal terminal CLK inputs a low level signal. And, the first transistor M11 is turned on to charge the capacitor C, and an electric potential of the pull-up node PU is increased. The third transistor M13 is turned on, and the signal output terminal OUT of the shift register outputs the low level signal. In an output phase, the input terminal IN inputs the low level signal, and the clock signal terminal inputs the high level signal. And, the third transistor M13 is turned on, the signal output terminal OUT outputs the high level signal. In addition, under the bootstrapping effect of the capacitor C, the electric potential of the pull-up node is further increased. In a reset phase, the reset terminal RESET inputs the high level signal, the second transistor M12 and the fourth transistor M14 are turned on, such that the pull-up node PU and the signal output terminal OUT are electrically connected to the inactive signal terminal VSS.

In the above process, the pull-up node PU reaches a higher electric potential due to the bootstrapping effect of the capacitor C during the output phase. As a result, the third transistor M13 is subject to a higher bias voltage at the gate electrode, causing the threshold voltage (Vth) characteristics of the third transistor M13 to gradually drift. When the drift reaches a certain degree, switching characteristics of the third transistor M13 will change, resulting in an abnormal signal output, and further a poor display performance.

SUMMARY

In one aspect, the present disclosure provides a shift register. The shift register includes a first input circuit, a second input circuit, and a pull-up transistor. The first input circuit is coupled to a first input terminal and a first pull-up node, and configured to electrically connect the first input terminal to the first pull-up node when the first input terminal receives an active signal. The second input circuit is coupled to a second input terminal and a second pull-up node, and configured to electrically connect the second input terminal to the second pull-up node when the second input terminal receives an active signal. The pull-up transistor includes a first gate electrode coupled to the first pull-up node and a second gate electrode coupled to the second pull-up node.

In some embodiments, the pull-up transistor further includes a source electrode and a drain electrode. One of the source electrode and the drain electrode is coupled to a clock signal terminal, and the other one of the source electrode and the drain electrode is coupled to a signal output terminal.

In some embodiments, the shift register further includes a first capacitor and a second capacitor. The first capacitor includes a first end coupled to the first pull-up node and a second end coupled to the signal output terminal. The second capacitor includes a first end coupled to the second pull-up node and a second end coupled to the signal output terminal.

In some embodiments, the shift register further includes a reset circuit. The reset circuit is coupled to the first pull-up node, the second pull-up node, the signal output terminal, a reset terminal, and an inactive signal terminal. The reset circuit is configured to electrically connect the first pull-up node, the second pull-up node, and the signal output terminal to the inactive signal terminal when the reset terminal receives an active signal.

In some embodiments, the reset terminal includes a first reset port and a second reset port. The reset circuit includes a first reset sub-circuit, a second reset sub-circuit, and a third reset sub-circuit. The first reset sub-circuit is coupled to the first pull-up node, the first reset port, the second reset port, and the inactive signal terminal. The first reset sub-circuit is configured to electrically connect the first pull-up node to the inactive signal terminal when the first reset port or the second reset port receives an active signal. The second reset sub-circuit is coupled to the second pull-up node, the first reset port, the second reset port, and the inactive signal terminal. The second reset sub-circuit is configured to electrically connect the second pull-up node to the inactive signal terminal when one of the first reset port or the second reset port receives an active signal. The third reset sub-circuit is coupled to the signal output terminal, the first reset port, the second reset port and the inactive signal terminal. The third reset sub-circuit is configured to electrically connect the signal output terminal to the inactive signal terminal when the first reset port or the second reset port receives an active signal.

In some embodiments, the first reset sub-circuit includes a first reset transistor. The first reset transistor includes a first gate electrode coupled to the first reset port, a second gate electrode coupled to the second reset port, a source electrode, and a drain electrode. One of the source electrode and the drain electrode of the first reset transistor is coupled to the first pull-up node. The other one of the source electrode and the drain electrode of the first reset transistor is coupled to the inactive signal terminal.

In some embodiments, the second reset sub-circuit includes a second reset transistor. The second reset transistor includes a first gate electrode coupled to the first reset port, a second gate electrode coupled to the second reset port, a source electrode, and a drain electrode. One of the source electrode and the drain electrode of the second reset transistor is coupled to the second pull-up node. The other one of the source electrode and the drain electrode of the second reset transistor is coupled to the inactive signal terminal.

In some embodiments, the third reset sub-circuit includes a third reset transistor. The third reset transistor includes a first gate electrode coupled to the first reset port, a second gate electrode coupled to the second reset port, a source electrode, and a drain electrode. One of the source electrode and the drain electrode of the third reset transistor is coupled to the signal output terminal. The other one of the source electrode and the drain electrode of the third reset transistor is coupled to the inactive signal terminal.

In some embodiments, the pull-up transistor includes a double-gate thin film transistor.

In some embodiments, the first input circuit includes an input transistor. The input transistor includes a gate electrode coupled to the first input terminal, a source electrode, and a drain electrode. One of the source electrode and the drain electrode of the first input transistor is coupled to the first input terminal. The other one of the source electrode and the drain electrode of the first input transistor is coupled to the first pull-up node.

In some embodiments, the second input circuit includes an input transistor. The input transistor includes a gate electrode coupled to the second input terminal, a source electrode, and a drain electrode. One of the source electrode and the drain electrode of the second input transistor is coupled to the second input terminal. The other one of the source electrode and the drain electrode of the second input transistor is coupled to the second pull-up node.

Another aspect of the present disclosure provides a gate driving circuit. The gate driving circuit includes an N-stage shift register circuit and (N−1) gating circuits. The N-stage shift register circuit includes N shift registers coupled in a cascade structure. Each of the N shift registers includes a shift register, and N is an integer larger than 1. Each of the (N−1) gating circuits is coupled to one of a 1st-stage to an (N−1)-th-stage shift registers of the N-stage shift register. Each of the gating circuits includes an input terminal, a first control terminal, a second control terminal, a first output terminal, and a second output terminal. Each of the gating circuits is configured to electrically connect the input terminal to the first output terminal when the first control terminal receives an active signal, and to electrically connect the input terminal to the second output terminal when the second control terminal receives an active signal. The first input terminal of an n-th-stage shift register is coupled to the first output terminal of an n-th-stage gating circuit. The second input terminal of the n-th-stage shift register is coupled to the second output terminal of the n-th-stage gating circuit. The signal output terminal of the n-th-stage shift register is coupled to the input terminal of an (n+1)-th-stage gating circuit. The reset terminal of the n-th-stage shift register is coupled to the signal output terminal of the (n+1)-th-stage shift register. n is a positive integer and 1≤n<N. The input terminal of a 1st-stage gating circuit is coupled to a start vertical signal terminal.

In some embodiments, the gate driving circuit further includes a first control line and a second control line. The first control line is coupled to the first control terminals of the gating circuits. The first control line is configured to provide an active signal during a first display period for displaying a first image frame. The second control line is coupled to the second control terminals of the gating circuits. The second control line is configured to provide an active signal during a second display period for displaying a second image frame.

In some embodiments, the reset terminal includes a first reset port and a second reset port. The gating circuits are first gating circuits. The gate driving circuit further includes (N−1) second gating circuits. Each of the (N−1) gating circuits is coupled to one of the 1st-stage to the (N−1)-th-stage shift registers. Each of the second gating circuits includes an input terminal, a first control terminal, a second control terminal, a first output terminal, and a second output terminal. Each of the second gating circuits is configured to electrically connect the input terminal to the first output terminal when the first control terminal of the second gating circuit receives an active signal, and to electrically connect the input terminal to the second output terminal when the second control terminal of the second gating circuit receives an active signal. The first control terminal of the second gating circuit at each stage is coupled to the first control line. The second control terminal of the second gating circuit at each stage is coupled to the second control line. The input terminal of an n-th-stage second gating circuit is coupled to the signal output terminal of an (n+1)-th-stage shift register. The first output terminal of the n-th-stage second gating circuit is coupled to the first reset port of the n-th-stage shift register. The second output terminal of the n-th-stage second gating circuit is coupled to the second reset port of the n-th-stage shift register.

In some embodiments, each of the second gating circuits includes a first gating transistor and a second gating transistor. The first gating transistor includes a gate electrode coupled to the first control terminal of the second gating circuit, a source electrode, and a drain electrode. One of the source electrode and the drain electrode is coupled to the input terminal of the second gating circuit. The other one of the source electrode and the drain electrode is coupled to the first output terminal of the second gating circuit. The second gating transistor includes a gate electrode coupled to the second control terminal of the second gating circuit, a source electrode, and a drain electrode. One of the source electrode and the drain electrode is coupled to the input terminal of the second gating circuit. The other one of the source electrode and the drain electrode is coupled to the second output terminal of the second gating circuit.

In some embodiments, each of the gating circuits includes a first gating transistor and a second gating transistor. The first gating transistor includes a gate electrode coupled to the first control terminal of the gating circuit, a source electrode, and a drain electrode. One of the source electrode and the drain electrode is coupled to the input terminal of the gating circuit. The other one of the source electrode and the drain electrode is coupled to the first output terminal of the gating circuit. The second gating transistor includes a gate electrode coupled to the second control terminal of the gating circuit, a source electrode, and a drain electrode. One of the source electrode and the drain electrode is coupled to the input terminal of the gating circuit. The other one of the source electrode and the drain electrode is coupled to the second output terminal of the gating circuit.

Another aspect of the present disclosure provides a display device include a gate driving circuit.

Another aspect of the present disclosure provides a method for driving a shift register. The method includes, during a first display period displaying a first image frame, in a charging phase of the first display period, providing an active signal to the first input terminal and providing an inactive signal to the clock signal terminal, to electrically connect the first input terminal to the first pull-up node, and to electrically connect the clock signal terminal to the signal output terminal, in an output phase of the first display period, providing an active signal to the clock signal terminal and providing an inactive signal to the first input terminal, to float the first pull-up node, and to electrically connect the signal output terminal to the clock signal terminal, and in a reset phase of the first display period, providing an active signal to the reset terminal, to electrically connect the first pull-up node, the second pull-up node, and the signal output terminal to the inactive signal terminal. The method further includes, during a second display period displaying a second image frame, in a charging phase of the second display period, providing an active signal to the second input terminal and providing an inactive signal to the clock signal terminal, to electrically connect the second input terminal to the second pull-up node, and to electrically connect the clock signal terminal to the signal output terminal, in an output phase of the second display period, providing an active signal to the clock signal terminal and providing an inactive signal to the second input terminal, to float the second pull-up node, and to electrically connect the signal output terminal to the clock signal terminal, and in a reset phase of the second display period, providing an active signal to the reset terminal, to electrically connect the first pull-up node, the second pull-up node, and the signal output terminal to the inactive signal terminal.

In some embodiments, the reset terminal includes a first reset port and a second reset port. Providing the active signal to the reset terminal in the reset phase of the first display period includes providing the active signal to the first reset port. Providing the active signal to the reset terminal in the reset phase of the second display period includes providing the active signal to the second reset port.

BRIEF DESCRIPTION OF THE FIGURES

The following drawings are merely examples for illustrative purposes according to various disclosed embodiments and are not intended to limit the scope of the present disclosure.

FIG. 14 illustrates a flow chart of an exemplary driving method for an exemplary shift register according to various disclosed embodiments of the present disclosure.

Figure 1:
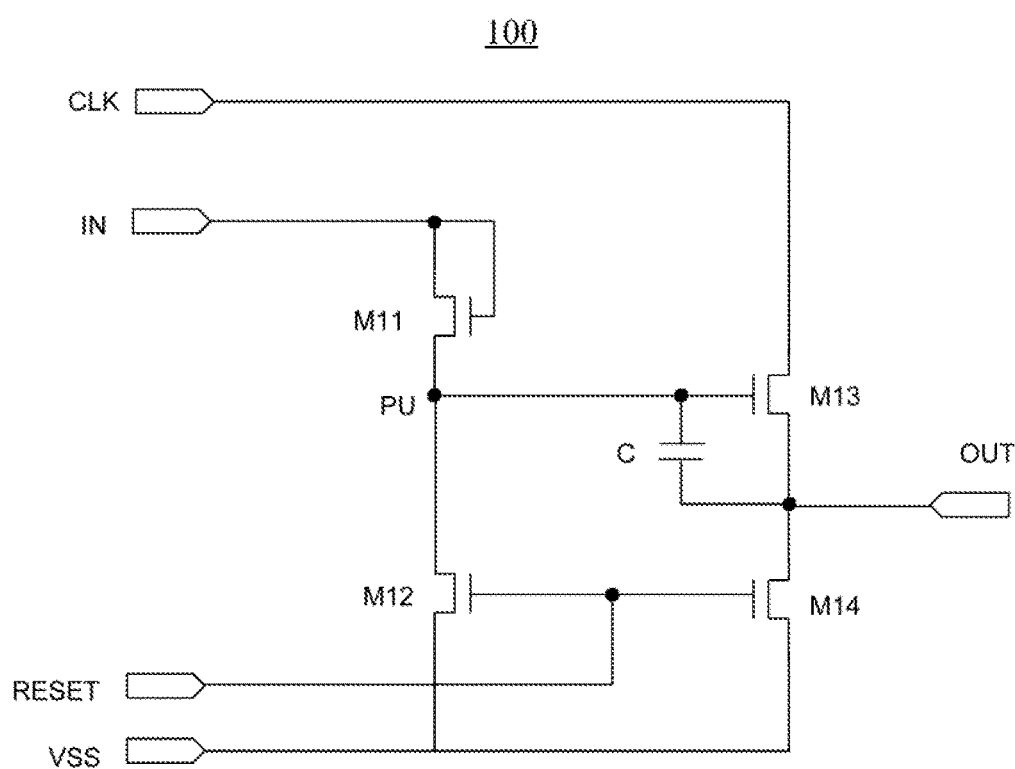
FIG. 1 illustrates a schematic view of a shift register in the existing technology.

Reference numerals used in the drawings include: M11, first transistor; M12, second transistor; M13, third transistor; M14, fourth transistor; C, capacitance; PU, pull-up node; IN, input terminal of shift register; OUT, signal output terminal; CLK, clock signal terminal; VSS, inactive signal terminal; RESET, reset terminal; 10, first input circuit; 20, second input circuit; 30, reset circuit; 31, first reset sub-circuit; 32, second reset sub-circuit; 33, third reset sub-circuit; IN_1, first input terminal; IN_2, second input terminal; RESET_1, first reset port; RESET_2, second reset port; first pull-up node; PU_2, second pull-up node; VSS, inactive signal terminal; 60, first gating circuit; 70, second gating circuit; M1, first input transistor; M2, second input transistor; M3, pull-up transistor; M4, first reset transistor; M5, second reset transistor; M6, third reset transistor; M21, first gating transistor; M22, second gating transistor; M23, third gating transistor; M24, fourth gating transistor; C1, first capacitor; C2, second capacitor; CLK, clock signal terminal; STV, start vertical signal terminal; CLK1, first clock supply terminal; CLK2, second clock supply terminal; VSS1, inactive signal supply terminal; 100, shift register in the existing technology; 200, exemplary shift register; 1000, exemplary gate driving circuit; 1300, exemplary display device; and 1400, exemplary driving method.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

Figure 2:
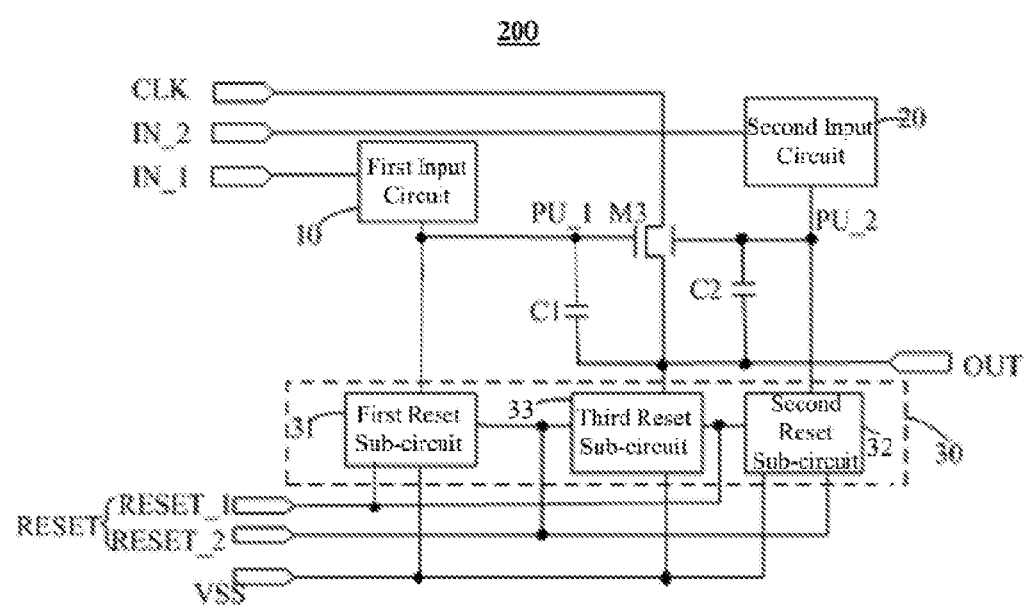
FIG. 2 illustrates a block diagram of an exemplary shift register according to various disclosed embodiments of the present disclosure.

The present disclosure provides a shift register. FIG. 2 illustrates a block diagram of an exemplary shift register 200 according to various disclosed embodiments of the present disclosure. As shown in FIG. 2, the shift register 200 includes a first input terminal IN_1, a second input terminal IN_2, a first pull-up node PU_1, a second pull-up node PU_2, a reset terminal RESET, a signal output terminal OUT, a clock signal terminal CLK, an inactive signal terminal VSS, a first input circuit 10, a second input circuit 20, a pull-up transistor M3, a first capacitor C1, a second capacitor C2, and a reset circuit 30. The first input circuit 10 is coupled to the first input terminal IN_1 and the first pull-up node PU_1, for electrically connecting the first input terminal IN_1 to the first pull-up node PU_1 when the first input terminal IN_1 receives an active signal. Here, the terminal "electrically connect," "electrically connecting," "electrically connected," or the like refers to establishing an electrical signal path. Thus, a terminal, node, port, electrode, or the like (collectively referred to as a "circuit point") being electrically connected to another circuit point refers establishing an electrical signal path between the two circuit points such that a signal received at one circuit point can be transmitted to the other circuit point.

The second input circuit 20 is coupled to the second input terminal IN_2 and the second pull-up node PU_2, for electrically connecting the second input terminal IN_2 to the second pull-up node PU_2 when the second input terminal IN_2 receives an active signal. In the example shown in FIG. 2, the pull-up transistor M3 includes a double-gate thin film transistor, having a first gate electrode coupled to the first pull-up node PU_1 and a second gate electrode coupled to the second pull-up node PU_2. The pull-up transistor M3 further includes a source electrode and a drain electrode. In the transistor M3, one of the source electrode and the drain electrode is coupled to the clock signal CLK, and the other one of the source electrode and the drain electrode is coupled to the signal output terminal OUT.

A first end of the first capacitor C1 is coupled to the first pull-up node PU_1. A second end of the first capacitor C1 is coupled to the signal output terminal OUT. A first end of the second capacitor C2 is coupled to the second pull-up node PU_2. A second end of the second capacitor C2 is coupled to the signal output terminal OUT. The reset circuit 30 is coupled to the first pull-up node PU_1, the second pull-up node PU_2, the signal output terminal OUT, the reset terminal RESET and the inactive signal terminal VSS, for electrically connecting the first pull-up node PU_1, the second pull-up node PU_2, and the signal output terminal OUT to the inactive signal terminal VSS when the reset terminal RESET receives an active reset signal.

In some embodiments of the present disclosure, descriptions are made with respect to the scenarios that the thin film transistors are N-type thin film transistors as examples, and correspondingly a turn-on signal is, for example, a high level signal and. In some other embodiments, the thin film transistors can be P-type thin film transistors, and correspondingly the turn-on signal can be a low level signal.

In the existing technology, referring back to FIG. 1, the pull-up node of the shift register 100 can reach a higher electric potential during an output phase, such that the third transistor M13, which is controlled by the pull-up node PU, is subject to a higher gate electrode bias voltage. In the present disclosure, as shown in FIG. 2, the pull-up transistor M3 of the shift register 200 is a double-gate thin film transistor having a bottom gate and a top gate that are approximately symmetrical with respect to each other. The two corresponding gate electrodes are controlled by the first pull-up node PU_1 and the second pull-up node PU_2, respectively. To drive the shift register 200, turn-on signals may be provided to the first input terminal IN_1 and the second input terminal IN_2, respectively, while two adjacent image frames are displayed. Accordingly, the pull-up transistor M3 may be controlled by the first pull-up node PU_1 and the second pull-up node PU_2, respectively, when the two adjacent image frames are displayed. Consequently, the pull-up transistor M3 can be subject to opposite bias voltage stresses when the two adjacent image frames are displayed, and hence drifts caused by the opposite bias stresses can cancel each other. As a result, a threshold characteristics drift of the pull-up transistor M3 can be reduced, an output stability of the shift register 200 can be improved, and a display performance of the display device can be improved.

Multiple shift registers can be cascaded to form a multi-stage shift register, with each shift register constituting one stage of the multi-stage shift register. For a certain shift register in the cascade, a shift register that is one stage after that certain shift register is also referred to as a "lower-one-stage shift register." Consistent with the disclosure, the reset terminal RESET of the shift register 200 can be coupled to the signal output terminal OUT of the lower-one-stage shift register. As a result, when the lower-one-stage shift register outputs an active signal, the reset circuit 30 can reset the first pull-up node PU_1, the second pull-up node PU_2, and the signal output terminal OUT in the current stage, i.e., the shift register 200, to ensure normal output. When the reset terminal RESET receives an active signal, the reset circuit 30 may electrically connect the first pull-up node PU_1, the second pull-up node PU_2, and the signal output terminal OUT to the inactive signal terminal VSS. As a result, in each image frame, after the shift register 200 outputs an active signal, the first pull-up node PU_1, the second pull-up node PU_2, and the signal output OUT can be reset, to ensure normal output.

Figure 3:
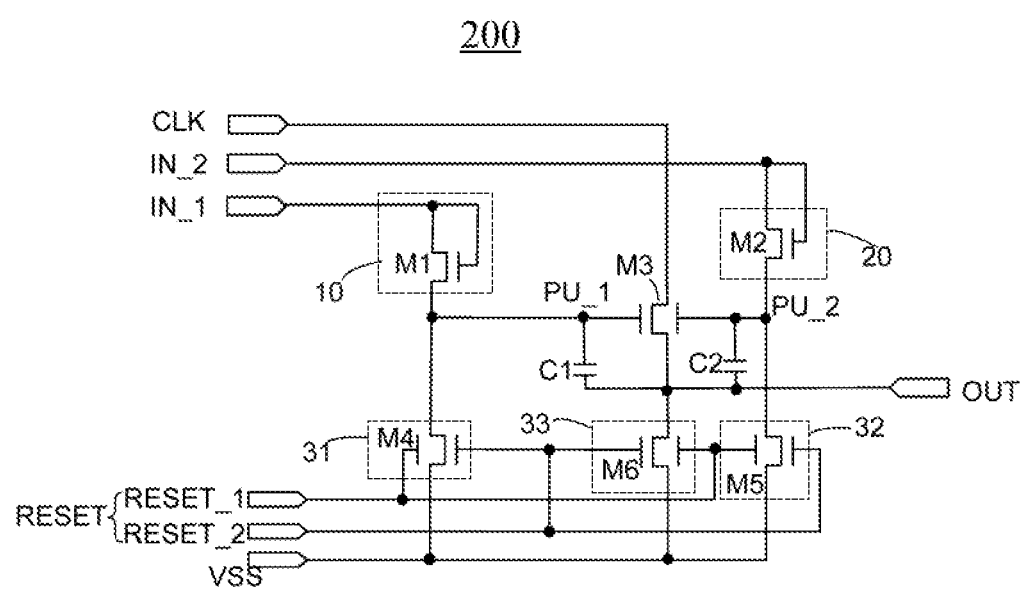
FIG. 3 illustrates a schematic view showing exemplary structural details of the shift register in FIG. 2 according to various disclosed embodiments of the present disclosure.

FIG. 3 illustrates a schematic view showing exemplary structural details of the shift register 200 according to various disclosed embodiments of the present disclosure. As shown in FIG. 3, the first input circuit 10 includes a first input transistor M1. The first input transistor M1 includes a gate electrode coupled to the first input terminal IN_1, a source electrode, and a drain electrode. In the first input transistor M1, one of the source electrode and the drain electrode is coupled to the first input terminal IN_1 and the other one of the source electrode and the drain electrode is coupled to the first pull-up node PU_1.

As shown in FIG. 3, the second input circuit 20 includes a second input transistor M2. The second input transistor M2 includes a gate electrode coupled to the second input terminal IN_2, a source electrode, and a drain electrode. In the second input transistor M2, one of the source electrode and the drain electrode is coupled to the second input terminal IN_2 and the other one of the source electrode and the drain electrode is coupled to the second pull-up node PU_2.

The reset terminal RESET includes a first reset port RESET_1 and a second reset port RESET_2. The reset circuit 30 includes a first reset sub-circuit 31, a second reset sub-circuit 32, and a third reset sub-circuit 33. The first reset sub-circuit 31 is coupled to the first pull-up node PU_1, the first reset port RESET_1, the second reset port RESET_2, and the inactive signal terminal VSS. Accordingly, when the first reset port RESET_1 or the second reset port RESET_2 receives an active signal, the first reset sub-circuit 31 can electrically connect the first pull-up node PU_1 and the inactive signal terminal VSS. The second reset sub-circuit 32 is coupled to the second pull-up node PU_2, the first reset port RESET_1, the second reset port RESET_2, and the inactive signal terminal VSS. Accordingly, when the first reset port RESET_1 or the second reset port RESET_2 receives an active signal, the second reset sub-circuit 32 can electrically connect the second pull-up node PU_2 to the inactive signal terminal VSS. The third reset sub-circuit 33 is coupled to the signal output terminal OUT, the first reset port RESET_1, the second reset port RESET_2, and the inactive signal terminal VSS. Accordingly, when the first reset port RESET_1 or the second reset port RESET_2 receives an active signal, the third reset sub-circuit 33 can electrically connect the signal output terminal OUT and the inactive signal terminal VSS.

Similar to the first input terminal IN_1 and the second input terminal IN_2, the reset terminal RESET also includes two reset ports, i.e., the first reset port RESET_1 and the second reset port RESET_2. Accordingly, when two adjacent image frames are displayed, in a reset phase, the shift register 200 can reset the corresponding nodes which need to be pulled down, according to the first reset port RESET_1 and the second reset port RESET_2, respectively. The corresponding nodes which need to be pulled down may be the first pull-up node PU_1, the second pull-up node PU_2, and the signal output terminal OUT.

The first reset sub-circuit 31 includes a first reset transistor M4, which includes a double-gate thin film transistor. The first reset transistor M4 includes a first gate electrode coupled to the first reset port RESET_1, a second gate electrode coupled to the second reset port RESET_2, a source electrode, and a drain electrode. In the first reset transistor M4, one of the source electrode and the drain electrode is coupled to the first pull-up node PU_1 and the other one of the source electrode and the drain electrode is coupled to the inactive signal terminal VSS. As a result, when the first gate electrode or the second gate electrode of the first reset transistor M4 receives an active signal, the first reset transistor M4 may be turned on, and the source electrode and the drain electrode of the first reset transistor M4 may be electrically connected.

The second reset sub-circuit 32 includes a second reset transistor M5, which includes a double-gate thin film transistor. The second reset transistor M5 includes a first gate electrode coupled to the first reset port RESET_1, a second gate electrode coupled to the second reset port RESET_2, a source electrode, and a drain electrode. In the second reset transistor M5, one of the source electrode and the drain electrode is coupled to the second pull-up node PU_2 and the other one of the source electrode and the drain electrode is coupled to the inactive signal terminal. VSS. As a result, when the first gate electrode or the second gate electrode of the second reset transistor M5 receives an active signal, the second reset transistor M5 may be turned on, and the source electrode and the drain electrode of the second reset transistor M5 may be electrically connected.

The third reset sub-circuit 33 includes a third reset transistor M6 which includes a double-gate thin film transistor. The third reset transistor M6 includes a first gate coupled to the first reset port RESET_1, a second gate coupled to the second reset port RESET_2, a source electrode, and a drain electrode. In the third reset transistor M6, one of the source electrode and the drain electrode is coupled to the signal output terminal OUT and the other one of the source electrode and the drain electrode is coupled to the inactive signal terminal VSS. As a result, when the first gate electrode or the second gate electrode of the third reset transistor M6 receives an active signal, the third reset transistor M6 may be turned on, and the source electrode and the drain electrode of the third reset transistor M6 may be electrically connected.

Similar to the pull-up transistor M3, in the present disclosure, the first reset transistor M4, the second reset transistor M5, and the third reset transistor M6 may all be configured as double-gate thin film transistors. As a result, the gate electrodes in each of the first reset transistor M4, the second reset transistor M5, and the third reset transistor M6 can be controlled by the first reset port RESET_1 and the second reset port RESET_2, respectively. When an odd-numbered image frame and an even-numbered image frame are displayed, each reset transistor may be controlled using the first reset port RESET_1 and the second reset port RESET_2, respectively. Accordingly, each reset transistor may be subject to the opposite bias voltage stresses during the display of the adjacent two image frames. The drifts in the reset transistors caused by the opposite bias voltage stresses may cancel each other. Accordingly, threshold characteristics drift in the three reset transistors may be reduced, and the output stability of the shift register 200 may be further improved.

Figure 4:
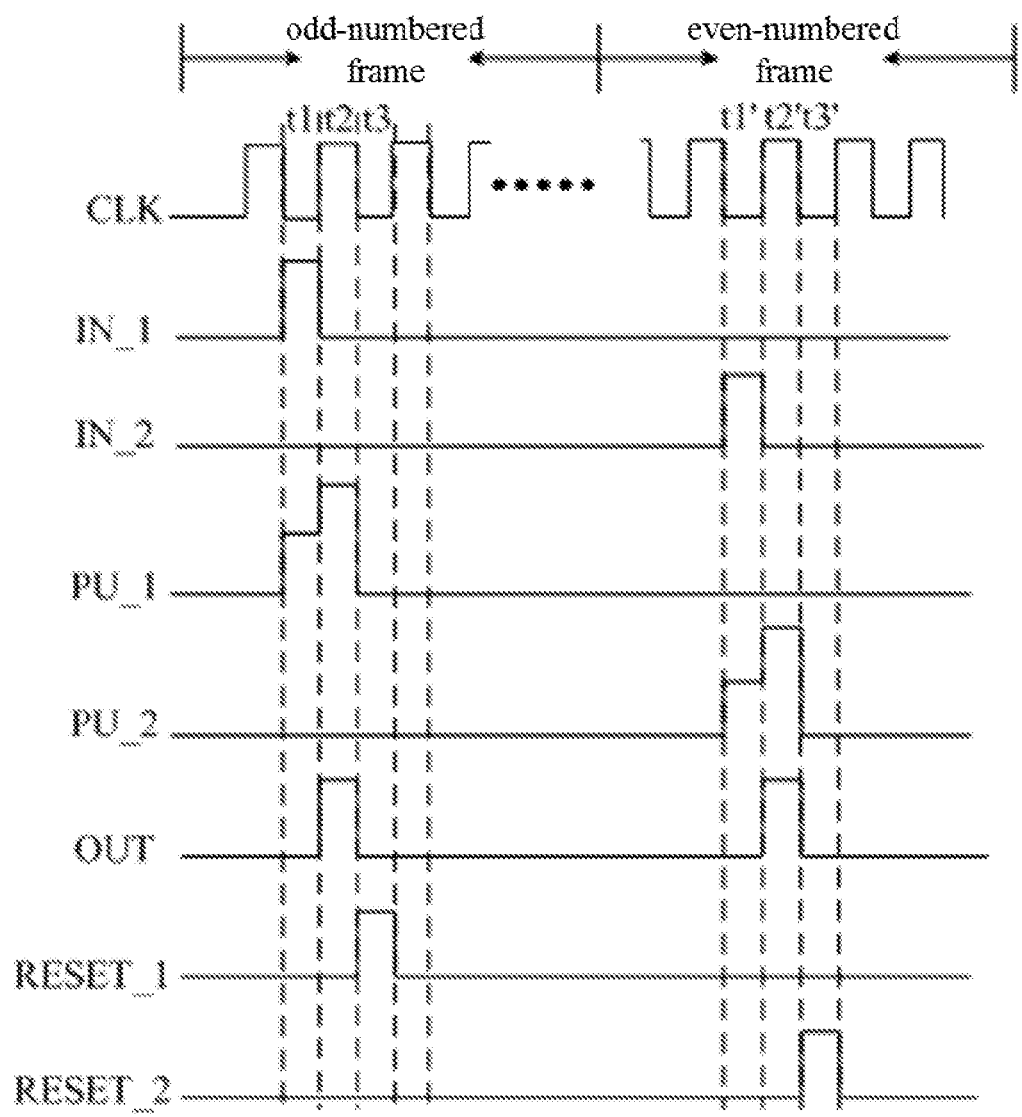
FIG. 4 illustrates an exemplary driving scheme of an exemplary shift register according to various disclosed embodiments of the present disclosure.

The operation of the shift register 200 will be described below with reference to FIGS. 4 to 9. FIG. 4 illustrates an exemplary driving scheme of an exemplary shift register according to various disclosed embodiments of the present disclosure.

Descriptions will now be made for the operation of the shift register 200 when displaying an odd-numbered image frame, i.e., in an odd-numbered display period.

In the present disclosure, process descriptions for an even-numbered display period, i.e., process descriptions for displaying an even-numbered image frame, and process descriptions for an odd-numbered display period, i.e., process descriptions for displaying an odd-numbered image frame are merely for illustrative purposes, and do not limit the scope of the present disclosure. In the present disclosure, process described for an even-numbered display period, i.e., process described for displaying an even-numbered image frame, and process described for an odd-numbered display period, i.e., process described for displaying an odd-numbered image frame can be switched. For example, in some embodiments, a process P_A may be a process for an even-numbered display period, and a process P_B may be a process for an odd-numbered display period. In some other embodiments, the process P_B may be a process for an even-numbered display period, and the process P_A may be a process for an odd-numbered display period.

In some embodiments, an odd-numbered display period can be a first period, and an even-numbered display period can be a second period. In these embodiments, as the first period and the second period may repeat alternately, the odd-numbered display period and the even-numbered display period may repeat alternately. In some other embodiments, an even-numbered display period can be a first period, and an odd-numbered display period can be a second period. Accordingly, as the first period and the second period may repeat alternately, the even-numbered display period and the odd-numbered display period may repeat alternately. In the present disclosure, whether a first period is an odd-numbered display period or an even-numbered display period is not restricted, and may be selected according to various application scenarios. Further, whether a second period is an odd-numbered display period or an even-numbered display period is not restricted, and may be selected according to various application scenarios.

Figure 5:
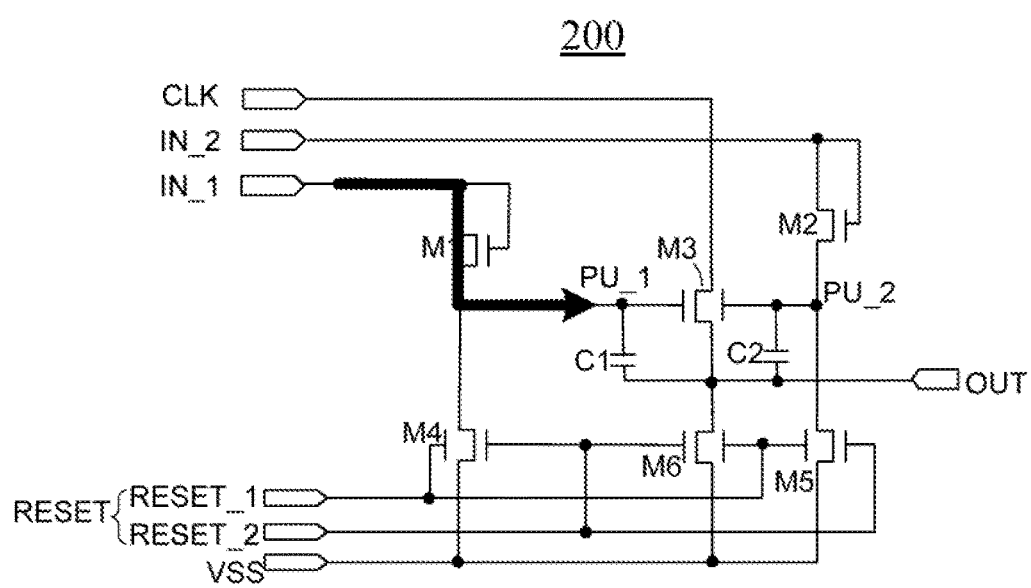
FIG. 5 schematically shows a major current flow in the shift register in FIG. 2 and FIG. 3 in a charging phase in an odd-numbered display period according to various disclosed embodiments of the present disclosure.

In a charging phase of the shift register 200, i.e., phase t1 FIG. 4, an active signal is provided to the first input terminal IN_1 of the shift register, and an inactive signal is provided to the clock signal CLK. Other signal terminals or ports are provided with an inactive signal if not otherwise mentioned (similarly hereinafter). Accordingly, the first input transistor M1 is turned on, the first input terminal IN_1 charges the first capacitor C1, and the first pull-up node PU_1 reaches the active electric potential, such that the pull-up transistor M3 is turned on, and the signal output terminal OUT is electrically connected to the clock signal terminal CLK and outputs the inactive signal. Other transistors are turned off if not otherwise mentioned (similarly hereinafter). FIG. 5 schematically shows the major current flow in the shift register 200 during the charging phase. As shown in FIG. 5, during the charging phase, the major current flow starts from the first input terminal IN_1, passes the first input transistor M1, and moves toward the first pull-up node PU_1.

Figure 6:
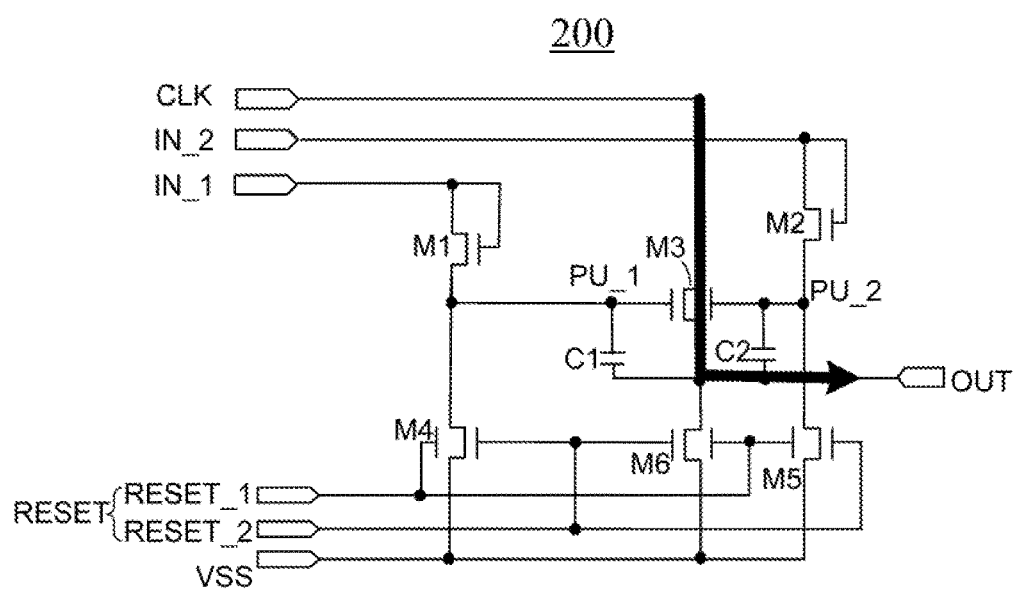
FIG. 6 schematically shows a major current flow in the shift register in FIG. 2 and FIG. 3 in an output phase in an odd-numbered display period according to various disclosed embodiments of the present disclosure.

In an output phase of the shift register 200, i.e., phase t2 in FIG. 4, an inactive signal is provided to the first input terminal IN_1 of the shift register 200, and an active signal is provided to the clock signal terminal CLK. Accordingly, the first input transistor M1 turned off, the pull-up transistor M3 is turned on, the signal output terminal OUT outputs an active signal. Under the bootstrapping effect of the first capacitor C1, the electric potential of the first pull-up node PU_1 is further increased. FIG. 6 schematically shows the major current flow in the shift register 200 during the output phase. As shown in FIG. 6, during the output phase, the major current flow starts from the clock signal terminal CLK, passes the pull-up transistor M3, and moves toward the signal output terminal OUT.

Figure 7:
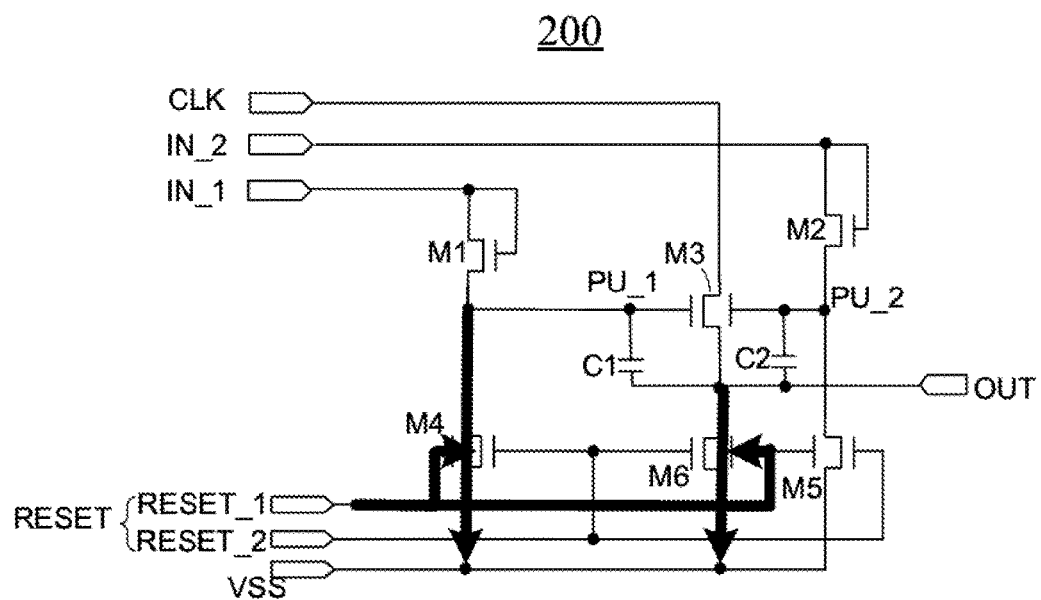
FIG. 7 schematically shows major current flows in the shift register in FIG. 2 and FIG. 3 in a reset phase in an odd-numbered display period according to various disclosed embodiments of the present disclosure.

In a reset phase of the shift register 200, i.e., phase t3 in FIG. 4, an active signal is provided to the first reset port RESET_1. Accordingly, the first reset transistor M4, the second reset transistor M5, and the third reset transistor M6 are turned on. As a result, the first pull-up node PU_1, the second pull-up node PU_2, and the signal output terminal OUT are electrically connected to the inactive signal terminal VSS, and the signal output terminal OUT outputs an inactive signal. FIG. 7 schematically shows the major current flows in the shift register 200 in the reset phase. As shown in FIG. 7, in the reset phase, the major current flows occur between the first reset port RESET_1 and the first gate electrode of the first reset transistor M4, between the first reset port RESET_1 and the first gate electrode of the third reset transistor M6, between the first pull-up node PU_1 and the inactive signal terminal VSS, and between the signal output terminal OUT and the inactive signal terminal VSS. The second pull-up node PU_2 has been staying at an inactive electric potential before phase t3. Thus, there is no current flow between the second pull-down node PU_2 and the inactive signal Terminal VSS in the reset phase.

Descriptions will now be made for the operation of the shift register 200 when displaying an even-numbered image frame, i.e. in an even-numbered display period.

Figure 8:
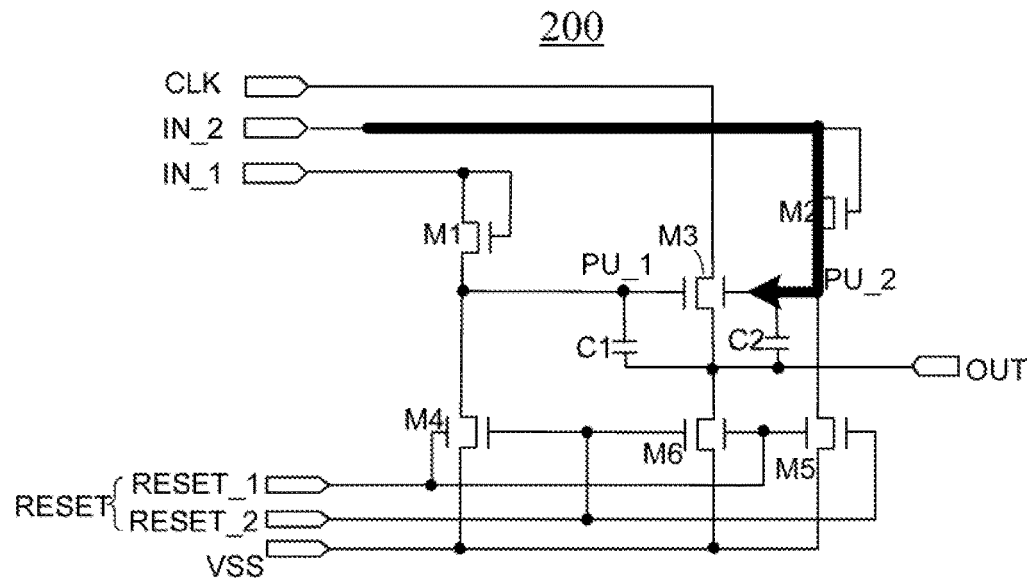
FIG. 8 schematically shows a major current flow in the shift register in FIG. 2 and FIG. 3 in a charging phase in an even-numbered display period according to various disclosed embodiments of the present disclosure.

In a charging phase of the shift register 200, i.e., phase t1' in FIG. 4, an active signal is provided to the second input terminal IN_2 of the shift register 200, and an inactive signal is provided to the clock signal terminal CLK. Accordingly, the second input transistor M2 is turned on, the second input terminal IN_2 charges the second capacitor C2, and the second pull-up node $PU_2$ reaches an active electric potential. As a result, the pull-up transistor M3 is turned on, and the signal output terminal OUT is electrically connected to the clock signal terminal CLK and outputs the inactive signal. FIG. 8 schematically shows the major current flow in the shift register 200 in the charging phase. As shown in FIG. 8, in the charging phase, the major current flow starts from the second input terminal IN_2, passes the second input transistor M2, and moves toward the second pull-up node PU_2.

In the output phase of the shift register 200, i.e., phase t2' in FIG. 4, an inactive signal is provided to the second input terminal IN_2 of the shill register, and an active signal is provided to the clock signal terminal CLK. Accordingly, the second input transistor M2 is turned off, the pull-up transistor M3 is turned on, and the signal output terminal OUT outputs an active signal. Under the bootstrapping effect of the second capacitor C2, the electric potential of the second pull-up node PU_2 is further increased. The major current flow of the shift register 200 in the output phase of the even-numbered image frame is same as the major current flow of the shift register 200 in the output phase of the odd-numbered display period shown in FIG. 6.

Figure 9:
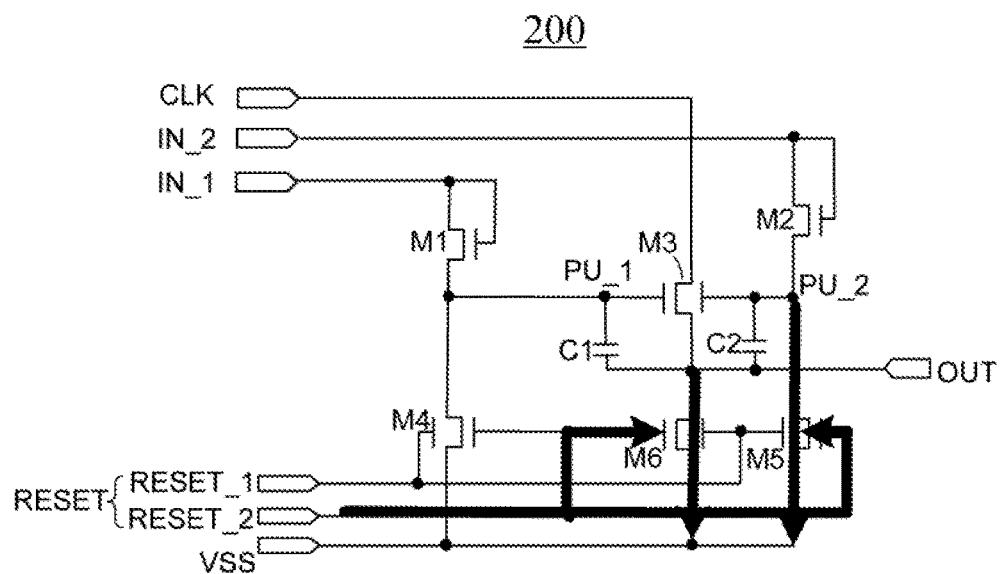
FIG. 9 schematically shows major current flows in the shift register in FIG. 2 and FIG. 3 in a reset phase in an even-numbered display period according to various disclosed embodiments of the present disclosure.

In the reset phase of the shift register 200, i.e., phase t3' in. FIG. 4, an active signal is provided to the second reset port RESET_2. Accordingly, the first reset transistor M4, the second reset transistor M5, and the third reset transistor M6 are turned on. As a result, the first pull-up node PU_1, the second pull-up node PU_2, and the signal output terminal OUT are electrically connected to the inactive signal terminal VSS, and the signal output terminal OUT outputs an inactive signal. FIG. 9 schematically shows the major current flows in the shift register 200 in the reset phase. As shown in FIG. 9, in the reset phase, the major current flows occur between the second reset port RESET_2 and the second gate electrode of the second reset transistor M5, between the second reset port RESET_2 and the second gate electrode of the third reset transistor M6, between the second pull-up node PU_2 and the inactive signal terminal VSS, and between the signal output terminal OUT and the inactive signal terminal VSS. Because the first pull-up node PU_1 has been staying at an inactive electric potential before phase t3', there is no current flow between the first pull-up node PU_1 and the inactive signal terminal VSS in the reset phase.

Figure 10:
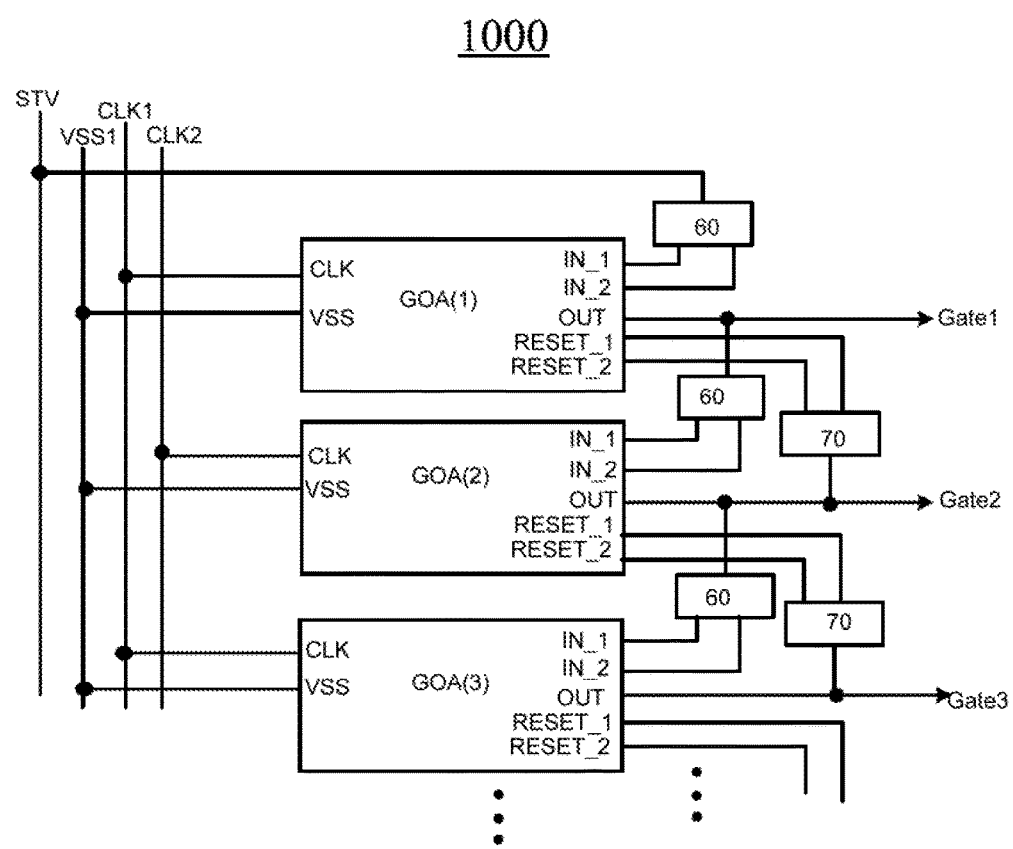
FIG. 10 illustrates a schematic view of an exemplary gate driving circuit according to various disclosed embodiments of the present disclosure.

The present disclosure provides a gate driving circuit. FIG. 10 illustrates a schematic view of an exemplary gate driving circuit 1000 according to various disclosed embodiments of the present disclosure. As shown in FIG. 10, the gate driving circuit 1000 is configured to provide scanning signals line-by-line to gate lines, e.g., Gate1, Gate2, etc. The gate driving, circuit 1000 includes an N-stage shift register including N shift registers, e.g., GOA(1), GOA(2), etc., as shown in FIG. 10. The gate driving circuit 1000 further includes (N−1) first gating circuits 60, which correspond to the 1st-stage to the (N−1)-th-stage shift registers, respectively, in a one-to-one correspondence. That is, the first gating circuits 60 may include (N−1) stages, and an n-th-stage first gating circuit 60 may correspond to an n-th-stage shift register. Each shift register included in the gate driving circuit 1000 may be any one of the shift registers consistent with the present disclosure. The shift register at each stage may correspond to a gate line and output a scanning signal to the corresponding gate line.

Figure 11:
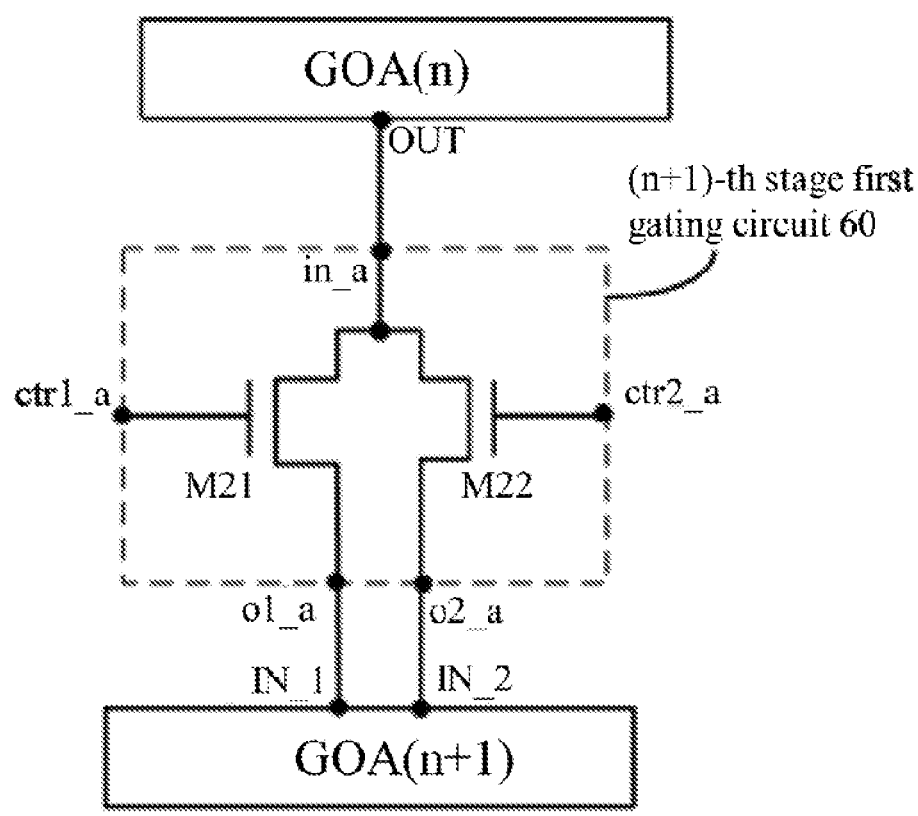
FIG. 11 illustrates a schematic view of an exemplary first gating circuit and an exemplary coupling relationship between the exemplary first gating circuit and exemplary shift registers according to various disclosed embodiments of the present disclosure.

FIG. 11 illustrates a schematic view of an exemplary first gating circuit and an exemplary coupling relationship between the exemplary first gating circuit and exemplary shift registers according to various disclosed embodiments of the present disclosure. With reference to FIGS. 10 and 11, the first gating circuit 60 includes an input terminal in_a, a first control terminal ctr1_a, a second control terminal ctr1_a, a first output terminal o1_a, and a second output terminal o2_a. The first gating circuit 60 may be used for electrically connecting the input terminal in_a to the first output terminal o1_a when the first control terminal ctr1_a receives an active signal, and for electrically connecting the input terminal in_a to the second output terminal o2_a when the second control terminal ctr2_a receives an active signal. The first input terminal IN_1 of the n-th-stage shift register is coupled to the first output terminal o1_a of the n-th stage first gating circuit 60. The second input terminal IN_2 of the n-th-stage shift register is coupled to the second output terminal o2_a of the n-th-stage first gating circuit 60. The signal output terminal OUT of the n-th-stage shift register is coupled to the input terminal in_a of the (n+1)-th-stage first gating circuit 60. The reset terminal RESET of the n-th-stage shift register is coupled to the signal output terminal OUT of the (n+1)-th-stage shift register. $1 \leq n < N$, and n is a positive integer. The input terminal in_a of the first stage first gating circuit 60 is coupled to the start vertical signal terminal STV.

As described above, in order to make the pull-up transistor M3 of a shift register receive opposite bias voltage stresses in two adjacent image frames, an active signal can be provided to the first input terminal IN_1 of the shift register in an odd-numbered image frame, and to the second input IN_2 in an even-numbered image frame. The first input terminal IN_1 and the second input terminal IN_2 of each shift register in the gate driving circuit 1000 can alternately receive an active signal in the odd-numbered frames and the even-numbered frames, respectively, by providing an active signal to the first control terminal ctr1_a of each first gating circuit 60 and the start vertical signal terminal STV when displaying the odd-numbered image frames, and providing an active signal to the second control terminal ctr2_a of each first gating circuit 60 and the start vertical signal terminal STV when displaying the even-numbered image frames. In this case, when displaying an odd-numbered image frame, the input terminal of each first gating circuit 60 may be electrically connected to the first output terminal of the first gating circuit $0. That is, the signal output terminal OUT of the n-th-stage shift register may be electrically connected to the first input terminal IN_1 of the (n+1)-th-stage shift register. When the n-th-stage shift register outputs an active signal, the first input terminal IN_1 of the (n+1)-th-stage shift register may receive the active signal. In addition, when the (n+1)-th-stage shift register outputs an active signal, the reset terminal RESET of the n-th-stage shift register may receive the active signal. Thus, the shift registers may sequentially output active signals.

When displaying an even-numbered image frame, the input terminal in_a of each first gating circuit 60 may be electrically connected to the second output terminal o2_a of the first gating circuit 60. That is, the signal output terminal OUT of the n-th-stage shift register may be electrically connected to the second input terminal IN_2 of the (n+1)-th-stage shift register. Thus, the shift registers may sequentially outputs active signals.

In order to facilitate the providing of control signals to the first control terminal ctr1_a and the second control terminal ctr2a of each first gating circuit 60, to perform the process of the shift registers successively outputting active signals in both odd-numbered image frames and even-numbered image frames, the gate driving circuit 1000 may further include a first control line (not shown) for providing an active signal when displaying an odd-numbered image frame, and a second control line (not shown) for providing an active signal when displaying an even-numbered image frame. The first control terminal ctr1_a of the first gating circuit 60 may be coupled to the first control line, and the second control terminal ctr2_a of the first gating circuit 60 may be coupled to the second control line.

According to the present disclosure, for "the reset terminal of the n-th-stage shift register is coupled to the signal output terminal OUT of the (n+1)-th-stage shift register," "the reset terminal of the n-th-stage shift register is coupled to the signal output terminal OUT of the (n+1)-th-stage shift register," "the reset terminal of the n-th-stage shift register is coupled to the signal output terminal OUT of the (n+1)-th-stage shift register," or the like, the reset terminal of the n-th-stage shift register may be directly or indirectly connected to the signal output terminal OUT of the (n+1)-th-stage shift register. In some embodiments, indirect connecting between the reset terminal of the n-th-stage shift register and the signal output terminal OUT of the (n+1)-th-stage shift register may be adopted, as described in more detail below.

Figure 12:
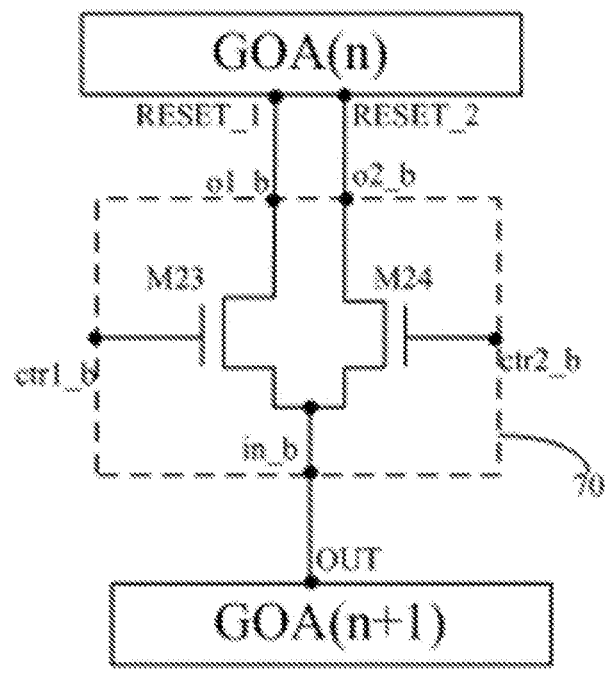
FIG. 12 illustrates a schematic view of an exemplary second gating circuit and an exemplary coupling relationship between the exemplary second gating circuit and exemplary shift registers according to various disclosed embodiments of the present disclosure.

In some embodiments, as shown in FIG. 10, the gate driving circuit 1000 further includes (N−1) second gating circuits 70, which correspond to the 1st-stage to the (N−1)-th-stage shift registers, respectively, in a one-to-one correspondence. The reset terminal RESET of the n-th-stage shift register is coupled to the signal output terminal OUT of the (n+1)-th-stage shift register through a second gating circuit 70, i.e., the n-th-stage second gating circuit 70. FIG. 12 illustrates a schematic view of an exemplary second gating circuit and an exemplary coupling relationship between the exemplary second gating circuit and exemplary shift registers according to various disclosed embodiments of the present disclosure. With reference to FIGS. 10 and 12, the second gating circuit 70 includes an input terminal in_b, a first control terminal ctr1_b, a second control terminal ctr2_b, a first output terminal o1_b, and a second output terminal o2_b. The second gating circuit 70 may be used for electrically connecting the input terminal in_b of the second gating circuit 70 to the first output terminal o1_b when the first control terminal ctr1_b of the second gating circuit 70 receives an active signal, and for electrically connecting the input terminal in_b to the second output terminal o2_b when the second control terminal ctr2_b of the second gating circuit 70 receives an active signal.

At each stage, the first control terminal ctr1_b of the second gating circuit 70 may be coupled to the first control line, and the second control terminal ctr1_b of the second gating circuit 7 may be coupled to the second control line. The input terminal in_b of the n-th stage second gating circuit 70 is coupled to the signal output terminal OUT of the (n+1)-th-stage shift register. The first output terminal o1_b of the n-th-stage second gating circuit 70 is coupled to the first reset port RESET_1 of the n-th-stage shift register. The second output terminal o2_b of the n-th-stage second gating circuit 70 is coupled to the second reset port RESET_2 of the n-th-stage shift register.

Thus, during displaying of an odd-numbered image frame, when the (n+1)-th-stage shift register outputs an active signal, where $1 \leq n < N$, and n is a positive integer, the active signal may be provided to the first reset terminal RESET_1 of the n-th-stage shift register, causing the first gate electrode of the first reset transistor M4, the first gate electrode of the second reset transistor M5, and the first gate electrode of the third reset transistor M6 to receive an active signal, thereby pulling down the electric potential of the first pull-up node PU_1 and the electric potential of the signal output terminal OUT.

During displaying of an even-numbered image frame, when the (n+1)-th-stages shift register outputs an active signal, the active signal may be provided to the second reset port RESET_2 of the n-th-stage shift register, causing the second gate electrode of the first reset transistor M4, the second gate electrode of the second reset transistor M5, and the second gate electrode of the third reset transistor M6 to receive an active signal, thereby pulling down the electric potential of the second pull-up node PU_2 and the electric potential of the signal output terminal OUT.

Accordingly, in the first reset transistor M4, the second reset transistor M5, and the third reset transistor M6, the two gate electrodes of each reset transistor may alternately reach an active electric potential in the reset phase of two adjacent image frames, such that each reset transistor may be subject to opposite bias voltage stresses in the two adjacent image frames, and further the drift in each reset transistor may be reduced.

In addition, in some embodiments, in order to provide a reset signal to the reset terminal RESET of the N-th-stage shift register, a reset signal may be separately provided to the reset terminal RESET of the N-th-stage shift register during the reset phase of the N-th-stage shift register. For example, a redundant shift register may be provided after the N-th-stage shift register. The redundant shift register can have a same structure as any of the above-described N shift registers. The redundant shift register can provide a reset signal to the reset terminal RESET of the N-th-stage shift register, without providing a scanning signal to a gate line. In addition, the first input terminal and the second input terminal of the redundant shift register can also be coupled to the signal output terminal OUT of the N-th-stage shift register through a first gating circuit 60. The signal output terminal of the redundant shift register can also be coupled to the first reset port RESET_1 and the second reset port RESET_2 of the N-th-stage shift register through a second gating circuit 70. The redundant shift register may be coupled to the corresponding first gating circuit 60 and the corresponding second gating circuit 70 in a same manner as how the above-described N shift registers are coupled to the corresponding first gating circuits 60 and the corresponding second gating circuits 70, which will not be further described here.

As shown in FIG. 11, in some embodiments, the first gating circuit 60 includes a first gating transistor M21 and a second gating transistor M22. The gate electrode of the first gating transistor M21 is coupled to the first control terminal ctr1_a of the first gating circuit 60. One of a source electrode and a drain electrode of the first gate transistor M21 is coupled to the input terminal in_a of the first gating circuit 60. The other one of the source electrode and the drain electrode of the first gate transistor M21 is coupled to the first output terminal o1_a of the first gating circuit 60. The gate electrode of the second gating transistor M22 is coupled to the second control terminal ctr2_a of the first gating circuit 60. One of a source electrode and a drain electrode of the second gating transistor M22 is coupled to the input terminal in_a of the first gating circuit 60. The other one of the source electrode and the drain electrode of the second gating transistor M22 is coupled to the second output terminal o2_a of the first gating circuit 60.

As shown in FIG. 12, in sonic embodiments, the second gating circuit 70 includes a third gating transistor M23 and a fourth gating transistor M24. The gate electrode of the third gating transistor M23 is coupled to the first control terminal ctr1_b of the second gating circuit 70. One of a source electrode and a drain electrode of the third gating transistor M23 is coupled to the input terminal in_b of the second gating circuit 70. The other one of the source electrode and the drain electrode of the third gating transistor M23 is coupled to the first output terminal o1_b of the second gating circuit 70. The gate electrode of the fourth gate transistor M24 is coupled to the second control terminal ctr2_b of the second gating circuit 70. One of a source electrode and a drain electrode of the fourth gating transistor M24 is coupled to the input terminal in_b of the second gating circuit 70. The other one of the source electrode and the drain electrode of the fourth gating transistor M24 is coupled to the second output terminal o2_b of the second gating circuit 70.

Referring again to FIG. 10, the gate driving circuit 1000 further includes an inactive signal supply terminal VSS1, a first clock supply terminal CLK1, and a second clock supply terminal CLK2. The first clock supply terminal CLK1 and the second signal supply terminal CLK2 may provide clock signals having opposite phases. Among every two adjacent shift registers, the clock signal terminal CLK of one of the two shift registers is coupled to the first clock supply terminal CLK1, and the clock signal terminal CLK of the other one of the two shift registers is coupled to the second clock supply terminal CLK2, to ensure that the clock signal terminal of the shift register at each stage can receive an active signal in the output phase. For example, as shown in FIG. 10, the clock signal terminal CLK of the 1st-stage shift register GOA(1) is coupled to the first clock supply terminal CLK1, the clock signal terminal CLK of the 2nd-stage shift register GOA(2) is coupled to the second clock supply terminal CLK2, and so on.

The present disclosure provides a display device comprising the gate driving circuit consistent with the disclosure. The display device may include an array substrate over which a plurality of gate lines are provided. The gate driving circuit can be arranged over the array substrate. And the shift registers of the gate driving circuit may be coupled to the plurality of gate lines in one-to-one correspondence, thereby sequentially providing scanning signals for the gate lines.

Figure 13:
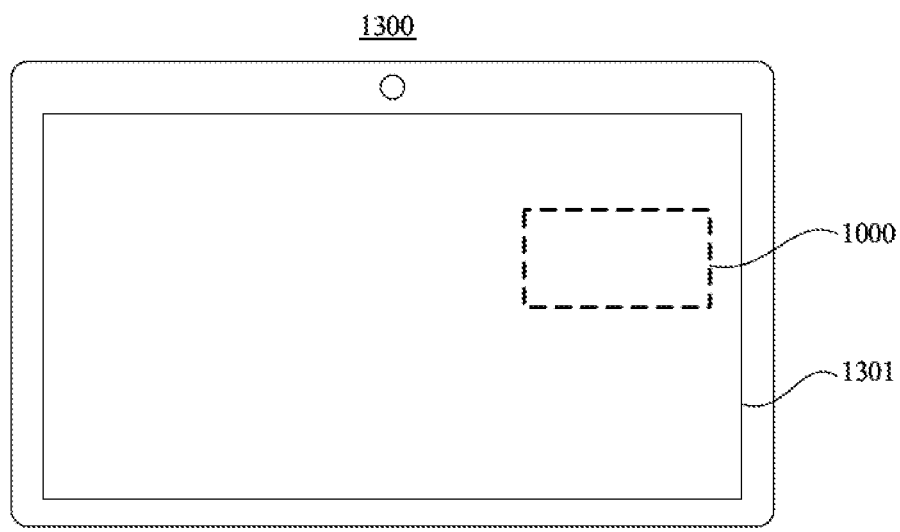
FIG. 13 illustrates a schematic view of an exemplary display device according to various disclosed embodiments of the present disclosure.

FIG. 13 illustrates a schematic view of an exemplary display device 1300 according to various disclosed embodiments of the present disclosure. The display device 1300 shown in FIG. 13 includes a gate driving circuit consistent with the disclosure. In addition to gate driving circuit consistent with the disclosure, the display device 1300 may flutter include other suitable structures. For example, as shown in FIG. 13, the display device 1300 includes a display panel 1301 which further includes the gate driving circuit 1000 consistent with the disclosure.

The display device 1300 can be, for example, a liquid crystal panel, an electronic paper, an organic light-emitting diode (OLED) panel, an active-matrix organic light-emitting diode (AMOLED) panel, a mobile phone, a tablet computer, a television, a monitor, a notebook computer, a digital photo frame, a navigating instrument, or any other suitable product or component having a display function. Any display device including a gate driving circuit consistent with the disclosure is within the scope of the present disclosure.

The present disclosure provides a driving method for the shift register consistent with the disclosure. FIG. 14 illustrates a flow chart of an exemplary driving method 1400 for an exemplary shift register according to various disclosed embodiments of the present disclosure. With reference to FIGS. 3-9 and FIG. 14, the driving method will be described in detail.

Descriptions will now be made for the driving method when an odd-numbered image frame is being displayed.

At S1411, in a charging phase of the shift register, e.g., phase t1 in FIG. 4, an active signal is provided to the first input terminal IN_1 of the shift register and an inactive signal is provided to the dock signal terminal CLK of the shift register, such that, in the shift register, the first input terminal IN_1 is electrically connected to the first pull-up node PU_1, the clock signal terminal CLK is electrically connected to the signal output terminal OUT, and the signal output terminal OUT outputs an inactive signal.

At S1412, in an output phase of the shift register, e.g., phase 12 in FIG. 4, an active signal is provided to the clock signal terminal CLK of the shift register and an inactive signal is provided to the first input terminal IN_1, such that the first pull-up node PU_1 floats, and the signal output terminal OUT is electrically connected to the clock signal terminal. As a result, the signal output terminal OUT outputs an active signal, and the electric potential of the first pull-up node PU_1 is further increased.

At S1413, in a reset phase of the shift register, e.g., phase t3 in FIG. 4, an active signal is provided to the reset terminal RESET of the shift register, such that the first pull-up node PU_1, the second pull-up node PU_2 of the shift register, and the signal output terminal OUT are electrically connected to the inactive signal terminal VSS.

Descriptions will now be made for the driving method when an even-numbered image frame is being displayed.

At S1421, in the charging phase of the shift register, e.g., phase t1' FIG. 4, an active signal is provided to the second input terminal IN_2 of the shift register and an inactive signal is provided to the clock signal terminal CLK, such that, in the shift register, the second input terminal IN_2 is electrically connected to the second pull-up node PU_2, the clock signal terminal CLK is electrically connected to the signal output terminal OUT, and the signal output terminal OUT outputs an inactive signal.

At S1422, in the output phase of the shift register, e.g., phase t2' in FIG. 4, an active signal is provided to the clock signal terminal CLK of the shift register and an inactive signal is provided to the second input terminal IN_2, such that the second pull-up node PU_2 floats, and the signal output terminal OUT is electrically connected to the clock signal terminal CLK. As a result, the signal output terminal OUT outputs an active signal, and the electric potential of the second pull-up node PU_2 is further increased.

At S1423, in the reset phase of the shift register, e.g., phase t3' in FIG. 4, an active signal is provided to the reset terminal RESET of the shift register, such that the first pull-up node PU_1, the second pull-up node PU_2, and the signal output terminal OUT are electrically connected to the inactive, signal terminal VSS.

The reset terminal RESET can include a first reset port RESET_1 and a second reset port RESET_2. In this case, when displaying an odd-numbered image frame, during the reset phase of the shift register, providing an active signal to the reset terminal RESET_1 of the shift register may include: providing the active signal to the first reset port RESET_1 of the shift register. When displaying an even-numbered image frame, during the reset phase of the shift register, providing an active signal to the reset terminal RESET of the shift register may include: providing the active signal to the second reset port RESET_2 of the shift register. Accordingly, during the reset phase of each image frame, the first pull-up node PU_1 is electrically connected to the inactive signal terminal VSS through the first reset sub-circuit 31, the second pull-up node PU_2 is electrically connected to the inactive signal terminal VSS through the second reset sub-circuit 32, and the signal output terminal OUT is electrically connected to the inactive signal terminal VSS through the third reset sub-circuit 33.

In the present disclosure, process descriptions for an even-numbered display period, i.e., process descriptions for displaying an even-numbered image frame, and process descriptions for an odd-numbered display period, i.e., process descriptions for displaying an odd-numbered image frame are merely for illustrative purposes, and do not limit the scope of the present disclosure. In the present disclosure, process described for an even-numbered display period, i.e., process described for displaying an even-numbered image frame, and process described for an odd-numbered display period, i.e., process described for displaying an odd-numbered image frame can be switched. For example, in some embodiments, a process P_A may be a process for an even-numbered display period, and a process P_B may be a process for an odd-numbered display period. In some other embodiments, the process P_B may be a process for an even-numbered display period, and the process P_A may be a process for an odd-numbered display period.

The operation of the shift register has been described above with reference to the structure of the shift register, which will not be further described here.

In the shift register, driving method thereof, gate driving circuit and display device consistent with the present disclosure, the pull-up transistor may be a double-gate thin film transistor, having a bottom gate and a top gate which are approximately symmetrical to each other. The two gate electrodes may be controlled by the first pull-up node and the second pull-up node, respectively. Thus, when driving the shift register, an turn-on signal can be provided to the first input terminal and the second input terminal in the display periods of two adjacent image frames, respectively, such that the pull-up transistor can be controlled by the first pull-up node and the second pull-up node in the display periods of two adjacent image frames, respectively.

Accordingly, the pull-up transistor can be subject to opposite bias voltage stresses in the display periods of two adjacent image frames and corresponding drifts caused by opposite bias voltage stresses may cancel each other. As a result, drift of threshold characteristics in the pull-up transistor can be reduced, the output stability of the shift register can be improved, and the display performance of the display device can be improved. Further, all the first reset transistor, the second reset transistor, and the third reset transistor of the reset circuit can also be double-gate thin film transistors, and drift of the threshold voltage can also be reduced. In addition, the number of transistors in the shift register is small, ands the overall structure is simple, facilitating the implementation of a narrow bezel.

The present disclosure provides a shift register, a driving method thereof, a gate driving circuit, and a display device. The shift register may include a first input terminal; a second input terminal; a first pull-up node; a second pull-up node; a reset terminal; a signal output terminal; a clock signal terminal; a first input circuit coupled to the first input terminal and the first pull-up node; a second input circuit coupled to the second input terminal and the second pull-up node; a pull-up transistor which is a double-gate thin film transistor, and has a first gate coupled to the first pull-up node, a second gate coupled to the second pull-up node, a first electrode of a source electrode and a drain electrode coupled to the clock signal terminal, and a second electrode of the source electrode and the drain electrode coupled to the signal output terminal; a first capacitor having a first end coupled to the first pull-up node and a second end coupled to the signal output terminal; a second capacitor having a first end coupled to the second pull-up node and a second end coupled to the signal output terminal; and a reset circuit coupled to the first pull-up node, the second pull-up node, the signal output terminal, the reset terminal, and an inactive signal terminal. The present disclosure may reduce the threshold characteristics drift in the pull-up transistor.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A shift register, comprising:
  a first input circuit coupled to a first input terminal and a first pull-up node, the first input circuit being configured to electrically connect the first input terminal to the first pull-up node when the first input terminal receives an active signal;
  a second input circuit coupled to a second input terminal and a second pull-up node, the second input circuit being configured to electrically connect the second input terminal to the second pull-up node when the second input terminal receives an active signal;
  a pull-up transistor including a first gate electrode coupled to the first pull-up node and a second gate electrode coupled to the second pull-up node; and
  wherein the pull-up transistor further includes a source electrode and a drain electrode, one of the source electrode and the drain electrode being coupled to a clock signal terminal, and the other one of the source electrode and the drain electrode being coupled to a signal output terminal;
  wherein the shift register further comprises a reset circuit coupled to the first pull-up node, the second pull-up node, the signal output terminal, a reset terminal, and an inactive signal terminal, the reset circuit being configured to electrically connect the first pull-up node, the second pull-up node, and the signal output terminal to the inactive signal terminal when the reset terminal receives an active signal,
  the reset terminal includes a first reset port and a second reset port, and
  the reset circuit includes:
    a first reset sub-circuit coupled to the first pull-up node, the first reset port, the second reset port, and the inactive signal terminal, the first reset sub-circuit being configured to electrically connect the first pull-up node to the inactive signal terminal when the first reset port or the second reset port receives an active signal;
    a second reset sub-circuit coupled to the second pull-up node, the first reset port, the second reset port, and the inactive signal terminal, the second reset sub-circuit being configured to electrically connect the second pull-up node to the inactive signal terminal when one of the first reset port or the second reset port receives an active signal; and
    a third reset sub-circuit coupled to the signal output terminal, the first reset port, the second reset port and the inactive signal terminal, the third reset sub-circuit being configured to electrically connect the signal output terminal to the inactive signal terminal when the first reset port or the second reset port receives an active signal;
  the first reset sub-circuit includes a first reset transistor including a first gate electrode coupled to the first reset port, a second gate electrode coupled to the second reset port, a source electrode, and a drain electrode,
  one of the source electrode and the drain electrode of the first reset transistor is coupled to the first pull-up node, and
  the other one of the source electrode and the drain electrode of the first reset transistor is coupled to the inactive signal terminal.

2. The shift register according to claim 1, further comprising:
  a first capacitor including a first end coupled to the first pull-up node, and a second end coupled to the signal output terminal; and
  a second capacitor including a first end coupled to the second pull-up node, and a second end coupled to the signal output terminal.

3. The shift register according to claim 1, wherein:
  the second reset sub-circuit includes a second reset transistor including a first gate electrode coupled to the first reset port, a second gate electrode coupled to the second reset port, a source electrode, and a drain electrode,
  one of the source electrode and the drain electrode of the second reset transistor is coupled to the second pull-up node, and
  the other one of the source electrode and the drain electrode of the second reset transistor is coupled to the inactive signal terminal.

4. The shift register according to claim 1, wherein:
  the third reset sub-circuit includes a third reset transistor including a first gate electrode coupled to the first reset port, a second gate electrode coupled to the second reset port, a source electrode, and a drain electrode,
  one of the source electrode and the drain electrode of the third reset transistor is coupled to the signal output terminal, and
  the other one of the source electrode and the drain electrode of the third reset transistor is coupled to the inactive signal terminal.

5. The shift register according to claim 1, wherein the pull-up transistor includes a double-gate thin film transistor.

6. The shift register according to claim 1, wherein:
  the first input circuit includes an input transistor including a gate electrode coupled to the first input terminal, a source electrode, and a drain electrode,
  one of the source electrode and the drain electrode of the first input transistor is coupled to the first input terminal, and
  the other one of the source electrode and the drain electrode of the first input transistor is coupled to the first pull-up node.

7. The shift register according to claim 1, wherein:
  the second input circuit includes an input transistor including a gate electrode coupled to the second input terminal, a source electrode, and a drain electrode, one of the source electrode and the drain electrode of the second input transistor is coupled to the second input terminal, and the other one of the source electrode and the drain electrode of the second input transistor is coupled to the second pull-up node.

8. A gate driving circuit, comprising:

an N-stage shift register circuit including N shift registers coupled in a cascade structure, each of the N shift registers including the shift register according to claim 1, and N being an integer larger than 1; and (N−1) gating circuits, each of the (N−1) gating circuits being coupled to one of a 1st-stage to an (N−1)-th-stage shift registers of the N-stage shift register, wherein:
 each of the gating circuits includes an input terminal, a first control terminal, a second control terminal, a first output terminal, and a second output terminal, and is configured to electrically connect the input terminal to the first output terminal when the first control terminal receives an active signal, and to electrically connect the input terminal to the second output terminal when the second control terminal receives an active signal,
 the first input terminal of an n-th-stage shift register is coupled to the first output terminal of an n-th-stage gating circuit,
 the second input terminal of the n-th-stage shift register is coupled to the second output terminal of the n-th-stage gating circuit,
 the signal output terminal of the n-th-stage shift register is coupled to the input terminal of an (n+1)-th-stage gating circuit,
 the reset terminal of the n-th-stage shift register is coupled to the signal output terminal of the (n+1)-th-stage shift register,
 n is a positive integer and 1≤n<N, and
 the input terminal of a 1st-stage gating circuit is coupled to a start vertical signal terminal.

9. The gate driving circuit according to claim 8, further comprising:

a first control line coupled to the first control terminals of the gating circuits, and configured to provide an active signal during a first display period for displaying a first image frame; and a second control line coupled to the second control terminals of the gating circuits, and configured to provide an active signal during a second display period for displaying a second image frame.

10. The gate driving circuit according to claim 9, wherein:

the reset terminal includes a first reset port and a second reset port, and the gating circuits are first gating circuits, the gate driving circuit further comprising:
 (N−1) second gating circuits, each of the (N−1) gating circuits being coupled to one of the 1st-stage to the (N−1)-th-stage shift registers,
 wherein:
  each of the second gating circuits includes an input terminal, a first control terminal, a second control terminal, a first output terminal, and a second output terminal, and is configured to electrically connect the input terminal to the first output terminal when the first control terminal of the second gating circuit receives an active signal, and to electrically connect the input terminal to the second output terminal when the second control terminal of the second gating circuit receives an active signal,
  the first control terminal of the second gating circuit at each stage is coupled to the first control line,
  the second control terminal of the second gating circuit at each stage is coupled to the second control line,
  the input terminal of an n-th-stage second gating circuit is coupled to the signal output terminal of an (n+1)-th-stage shift register,
  the first output terminal of the n-th-stage second gating circuit is coupled to the first reset port of the n-th-stage shift register, and
  the second output terminal of the n-th-stage second gating circuit is coupled to the second reset port of the n-th-stage shift register.

11. The gate driving circuit according to claim 10, wherein each of the second gating circuits includes:

a first gating transistor including a gate electrode coupled to the first control terminal of the second gating circuit, a source electrode, and a drain electrode, one of the source electrode and the drain electrode being coupled to the input terminal of the second gating circuit, and the other one of the source electrode and the drain electrode being coupled to the first output terminal of the second gating circuit; and a second gating transistor including a gate electrode coupled to the second control terminal of the second gating circuit, a source electrode, and a drain electrode, one of the source electrode and the drain electrode being coupled to the input terminal of the second gating circuit, and the other one of the source electrode and the drain electrode being coupled to the second output terminal of the second gating circuit.

12. The gate driving circuit according to claim 8, wherein each of the gating circuits includes:

a first gating transistor including a gate electrode coupled to the first control terminal of the gating circuit, a source electrode, and a drain electrode, one of the source electrode and the drain electrode being coupled to the input terminal of the gating circuit, and the other one of the source electrode and the drain electrode being coupled to the first output terminal of the gating circuit; and a second gating transistor includes a gate electrode coupled to the second control terminal of the gating circuit, a source electrode, and a drain electrode, one of the source electrode and the drain electrode being coupled to the input terminal of the gating circuit, and the other one of the source electrode and the drain electrode being coupled to the second output terminal of the gating circuit.

13. A display device comprising the gate driving circuit according to claim 8.

14. A method for driving the shift register according to claim 1, comprising:

during a first display period displaying a first image frame:

in a charging phase of the first display period, providing an active signal to the first input terminal and providing an inactive signal to the clock signal terminal, to electrically connect the first input terminal to the first pull-up node, and to electrically connect the clock signal terminal to the signal output terminal, in an output phase of the first display period, providing an active signal to the clock signal terminal and providing an inactive signal to the first input terminal, to float the first pull-up node, and to electrically connect the signal output terminal to the clock signal terminal, and in a reset phase of the first display period, providing an active signal to the reset terminal, to electrically connect the first pull-up node, the second pull-up node, and the signal output terminal to the inactive signal terminal; and during a second display period displaying a second image frame:

in a charging phase of the second display period, providing an active signal to the second input terminal and providing an inactive signal to the clock signal terminal, to electrically connect the second input terminal to the second pull-up node, and to electrically connect the clock signal terminal to the signal output terminal, in an output phase of the second display period, providing an active signal to the clock signal terminal and providing an inactive signal to the second input terminal, to float the second pull-up node, and to electrically connect the signal output terminal to the clock signal terminal, and in a reset phase of the second display period, providing an active signal to the reset terminal, to electrically connect the first pull-up node, the second pull-up node, and the signal output terminal to the inactive signal terminal, providing the active signal to the reset terminal in the reset phase of the first display period includes providing the active signal to the first reset port, and providing the active signal to the reset terminal in the reset phase of the second display period includes providing the active signal to the second reset port.

* * * * *